US012638504B2

(12) United States Patent
Kim et al.

(10) Patent No.: US 12,638,504 B2
(45) Date of Patent: May 26, 2026

(54) SWITCH DIAGNOSTIC DEVICE AND BATTERY PACK INCLUDING THE SAME

(71) Applicant: SAMSUNG SDI CO., LTD., Yongin-si (KR)

(72) Inventors: Duck-Hyun Kim, Yongin-si (KR); Giho Seo, Yongin-si (KR); Kwangmin Yoo, Yongin-si (KR); Kyosung Koo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 135 days.

(21) Appl. No.: 18/441,833

(22) Filed: Feb. 14, 2024

(65) Prior Publication Data

US 2024/0319276 A1 Sep. 26, 2024

(30) Foreign Application Priority Data

Mar. 22, 2023 (KR) ........................ 10-2023-0037525

(51) Int. Cl.
  *G01R 31/327* (2006.01)
  *G01R 27/08* (2006.01)
  (Continued)
(52) U.S. Cl.
  CPC ........... *G01R 31/327* (2013.01); *G01R 27/08* (2013.01); *H01M 10/425* (2013.01);
  (Continued)
(58) Field of Classification Search
  CPC .. G01R 31/327; G01R 27/08; G01R 31/3278; G01R 31/3272; G01R 31/3275;
  (Continued)

(56) References Cited

U.S. PATENT DOCUMENTS 11,287,476 B2 * 3/2022 Kim ...................... H01F 7/1844
2015/0191088 A1 7/2015 Gonzales et al.
(Continued)

FOREIGN PATENT DOCUMENTS

CN 109177808 A 1/2019
CN 208855459 U 5/2019
(Continued)

OTHER PUBLICATIONS

ADBMS6821 Single/Dual isoSPI Transceiver, Analog Devices, 2021 (Year: 2021).*

(Continued)

*Primary Examiner* — Daniel R Miller
(74) *Attorney, Agent, or Firm* — Womble Bond Dickinson (US) LLP

(57) ABSTRACT

One or more embodiments provide a switch diagnosis device including: a switch in a current path at a high voltage side; a voltage-sensing circuit configured to generate a voltage signal by sensing a voltage across the switch at the high voltage side; a current-sensing circuit configured to generate a current signal by detecting a current flowing through the current path; a controller configured to: receive the voltage signal and the current signal, calculate contact resistance of the switch based on the received voltage signal and the received current signal, and diagnose a deterioration state of the switch based on the calculated contact resistance; and a first isolated communication circuit configured to transfer the voltage signal outputted from the voltage-sensing circuit to the controller at a low voltage side that is galvanically isolated from the high voltage side.

20 Claims, 2 Drawing Sheets

(51) Int. Cl.

| | |
|---|---|
| *H01M 10/42* | (2006.01) |
| *H01M 10/48* | (2006.01) |
| *H01M 50/204* | (2021.01) |

(52) U.S. Cl.
CPC ....... *H01M 10/482* (2013.01); *H01M 50/204* (2021.01); *H01M 2010/4278* (2013.01)

(58) Field of Classification Search
CPC ........... G01R 19/145; G01R 19/16571; G01R 19/25; G01R 27/20; G01R 31/3274; H01M 10/425; H01M 10/482; H01M 50/204; H01M 2010/4278; G08C 17/02; G08C 19/02; H02M 3/33507
See application file for complete search history.

(56) References Cited

U.S. PATENT DOCUMENTS

| | | | |
|---|---|---|---|
| 2015/0276842 A1 | 10/2015 | Chang et al. | |
| 2016/0282420 A1* | 9/2016 | Baraszu ............. | G01R 31/3277 |
| 2017/0059657 A1 | 3/2017 | Park et al. | |
| 2023/0230788 A1 | 7/2023 | Miura et al. | |

FOREIGN PATENT DOCUMENTS

| | | | |
|---|---|---|---|
| CN | 112305415 | A | 2/2021 |
| JP | 3244064 | B2 | 1/2002 |
| JP | 2019184535 | A * | 10/2019 |
| JP | 6981437 | B2 | 12/2021 |
| KR | 10-2016-0040886 | A | 4/2016 |
| WO | WO 2021-250935 | A1 | 12/2021 |

OTHER PUBLICATIONS

Wynne: "Isolation in High-Voltage Battery Monitoring for Transportation Applications", Ana log Dialogue, Oct. 1, 2009, pp. 1-3.
Dimitrov, "Design and Experimental Verification of Voltage Measurement Circuits Based on Linear Optocouplers with Galvanic Isolation for Battery Management Systems", World Electric Vehicle Journal, vol. 10, No. 4, Sep. 23, 2019, p. 59.
Extended European Search Report dated May 27, 2024 for corresponding European Application No. 23218611.4 (10 pages).

* cited by examiner

1a

SWITCH DIAGNOSTIC DEVICE AND BATTERY PACK INCLUDING THE SAME

CROSS-REFERENCE TO RELATED APPLICATION

The present application claims priority to and the benefit of Korean Patent Application No. 10-2023-0037525, filed on Mar. 22, 2023, in the Korean Intellectual Property Office, the entire disclosure of which is incorporated herein by reference.

BACKGROUND

1. Field

The present disclosure relates to a switch diagnosis device and a battery pack including the same.

2. Description of the Related Art

A rechargeable or secondary battery differs from a primary battery in that charging and discharging can be repeated, and the primary battery only provides non-reversible conversion from chemical energy to electrical energy. A low-capacity rechargeable battery is used as a power supply device for small electronic devices such as portable telephones, laptops computers, and camcorders, and a high-capacity rechargeable battery is used as a power supply device for an energy storage system (ESS) or uninterruptible power supply (UPS) using medium or large batteries used for electric vehicles (EVs), hybrid vehicles (HVs), for home or industry system, etc.

In general, the secondary battery may include an electrode assembly including a positive electrode, a negative electrode, and a separator interposed between the positive electrode and the negative electrode, a case for accommodating the electrode assembly therein, and an electrode terminal electrically connected to the electrode assembly. An electrolyte solution is injected into the case to enable charging and discharging of the battery through an electrochemical reaction of the positive electrode, the negative electrode, and the electrolyte solution. A shape of the case, such as cylindrical or rectangular, depends on an application of the battery.

The rechargeable battery is used in the form of a battery module including a plurality of unit battery cells connected in series and/or in parallel, thereby providing high energy density for running (e.g., a hybrid vehicle). That is, the battery module is formed by interconnecting electrode terminals of a plurality of unit battery cells according to an amount of power that is suitable to implement a high-power rechargeable battery for an electric vehicle, for example. One or more battery modules are mechanically and electrically integrated to form a battery pack.

In a high voltage battery pack mounted in an electric vehicle or the like, a mechanical relay is mainly used as a switching means for opening and closing a high current path between the battery pack and an external device (load or charger). The mechanical relay has a disadvantage of being heavy and bulky and high current consumption of the secondary coil for control, and has an advantage in that energy loss of the battery pack can be reduced or minimized due to a characteristic having large insulation resistance (e.g., receiving Mega ohm) if a high current path is blocked.

The mechanical relay has a structure in which bus bars are mechanically connected by a magnetic force induced by a secondary side coil. In mechanical relays having such a structure, defects due to welding are continuously identified. In a process of repeating contact between bus bars constituting a relay, a direct contact current path between the bus bars is narrowed due to foreign matters plating peeling, and irregularities, and due to a phenomenon of current concentration to the local portion caused thereby, heat generation and contact resistance increase may occur, leading to defects such as welding.

If the coupling state between the bus bars is maintained due to welding, a high current path of the high voltage pack may not be blocked, which may cause a safety accident. Accordingly, to reduce or prevent the likelihood of an accident due to welding of a relay, methods for diagnosing welding occurrence using a voltage across a bus bar constituting the relay have been proposed. Such methods are useful only if the relay is out of order because it can only diagnose whether the relay is out of order, and there is a problem in that it may be difficult to predict a failure of the relay in advance and deal with it preemptively.

SUMMARY

One or more embodiments of the present disclosure provide a switch diagnosis device, and a battery pack including the same, capable of predicting a failure of a relay in advance such that preemptive measures can be taken before the failure of the relay.

One or more embodiments of the present disclosure provide a switch diagnosis device including: a switch in a current path at a high voltage side; a voltage-sensing circuit configured to generate a voltage signal by sensing a voltage across the switch at the high voltage side; a current-sensing circuit configured to generate a current signal by detecting a current flowing through the current path; a controller configured to receive the voltage signal and the current signal, calculate contact resistance of the switch based on the voltage signal and the current signal, and diagnose a deterioration state of the switch based on the contact resistance; and a first isolated communication circuit configured to transfer the voltage signal outputted from the voltage-sensing circuit to the controller at a low voltage side that is galvanically isolated from the high voltage side.

The first isolated communication circuit may include: a first sub-circuit configured to transmit the voltage signal received from the voltage-sensing circuit at the high voltage side to at low voltage side in an isolated communication method; and a second sub-circuit configured to transmit the voltage signal received from the first sub-circuit at the high voltage side to the controller at the low voltage side.

The switch diagnosis device may further include a power supply circuit configured to supply a supply voltage for driving the voltage-sensing circuit and the first sub-circuit.

The power supply circuit may be connected to a node between a power source at the high voltage side and the switch, and configured to determine a reference potential of the supply voltage based on a potential of the node.

The power supply circuit may include an isolated DC-DC converter configured to generate the supply voltage from a voltage inputted from the low voltage side.

The isolated DC-DC converter may be a flyback converter.

The voltage-sensing circuit may include: a differential amplifier circuit connected to opposite ends of the switch; and an analog-to-digital converter configured to generate the voltage signal from an output signal of the differential amplifier circuit, the voltage signal being a digital signal.

The current-sensing circuit may include: a shunt resistor connected to the current path; a sensing circuit configured to output a signal corresponding to a current flowing through the switch from a voltage across the shunt resistor; and an analog-to-digital converter configured to generate the current signal from a signal output from the sensing circuit, the current signal being a digital signal.

The switch diagnosis device may further include a second isolated communication circuit configured to transfer the current signal outputted from the current-sensing circuit to the controller at a low voltage side.

The controller may be further configured to calculate the contact resistance using the voltage signal and the current signal obtained by sensing a voltage across the switch and a current flowing through the switch during a period in which the current flowing through the current path in a state in which the switch is closed satisfies a condition.

The controller may be further configured to determine that the condition is satisfied if the current flowing through the current path is within a range and a differential value of the current flowing through the current path is within a value.

The switch may be a relay or a contactor.

One or more embodiments of the present disclosure provide a battery pack including: pack terminals; a battery module including a plurality of cells connected in series or parallel to each other between the pack terminals; a first switch connected between a first output terminal of the battery module and a first pack terminal from among the pack terminals at a high voltage side, the first switch being configured to open and close a current path between the pack terminals and the battery module; a first voltage-sensing circuit configured to generate a first voltage signal by sensing a voltage across the first switch at the high voltage side; a current-sensing circuit configured to generate a current signal by detecting a current flowing through the current path; a controller configured to receive the first voltage signal and the current signal, to calculate first contact resistance of the first switch based on the first voltage signal and the current signal, and to diagnose a deterioration state of the first switch based on the first contact resistance; and a first isolated communication circuit configured to transfer the first voltage signal outputted from the first voltage-sensing circuit to the controller at a low voltage side that is galvanically isolated from the high voltage side.

The first isolated communication circuit may include: a first high voltage sub-circuit configured to transmit the first voltage signal received from the first voltage-sensing circuit at the high voltage side in an isolated communication method; and a first low voltage sub-circuit configured to transmit the first voltage signal received from the first high voltage sub-circuit to the controller at the low voltage side.

The battery pack may further include a first power supply circuit configured to supply a first supply voltage for driving the first voltage-sensing circuit and the first high voltage sub-circuit.

A reference potential of the first supply voltage is determined based on a potential of the first output terminal.

The power supply circuit may include an isolated DC-DC converter configured to generate the first supply voltage from a voltage inputted from the low voltage side.

The voltage inputted from the low voltage side to the first power supply circuit may be a supply voltage supplied from a vehicle equipped with the battery pack.

The battery pack may further include: a second switch connected between a second output terminal of the battery module and a second pack terminal from among the pack terminals and configured to open and close the current path; a second voltage-sensing circuit configured to generate a second voltage signal by sensing a voltage across the second switch at the high voltage side; and a second isolated communication circuit configured to transmit the second voltage signal outputted from the second voltage-sensing circuit to the controller at the low voltage side.

The controller may be further configured to calculate second contact resistance of the second switch based on the second voltage signal and the current signal, and to diagnose a deterioration state of the second switch based on the second contact resistance.

The second isolated communication circuit may include: a second high voltage sub-circuit configured to transmit the second voltage signal received from the second voltage-sensing circuit at the high voltage side in an isolated communication method; and a second low voltage sub-circuit configured to transmit the second voltage signal received from the second high voltage sub-circuit to the controller at the low voltage side.

The battery pack may further include a second power supply circuit configured to supply a second supply voltage for driving the second voltage-sensing circuit and the second high voltage sub-circuit.

A reference potential of the second supply voltage is determined based on a potential of the second output terminal.

The first voltage-sensing circuit may include: a differential amplifier circuit connected to opposite ends of the first switch; and an analog-to-digital converter configured to generate the first voltage signal from an output signal of the differential amplifier circuit, the first voltage signal being a digital signal.

The battery pack may further include a second isolated communication circuit configured to transfer the current signal outputted from the current-sensing circuit to the controller at a low voltage side.

The current-sensing circuit may include a shunt resistor connected to the current path; a sensing circuit configured to output a signal corresponding to the current flowing in the current path from a voltage across the shunt resistor; and an analog-to-digital converter configured to generate the current signal from a signal output from the sensing circuit, the current signal being a digital signal.

The controller may be further configured to calculate the first contact resistance using the first voltage signal and the current signal obtained by sensing a voltage across the first switch and a current flowing through the first switch during a period in which the current flowing through the current path in a state in which the first switch is closed satisfies a condition.

The controller may be further configured to determine that the condition is satisfied if the current flowing through the current path is within a range and a differential value of the current flowing through the current path is within a value.

The first switch may be a relay or a contactor.

The battery pack may further include a temperature sensor configured to sense a temperature of the first switch.

The controller may be further configured to diagnose the deterioration state of the first switch based on a temperature signal received from the temperature sensor and the first contact resistance.

According to one or more embodiments, it is possible to preemptively cope with a failure of a relay by predicting the failure of the relay in advance.

DETAILED DESCRIPTION

Figure 1:
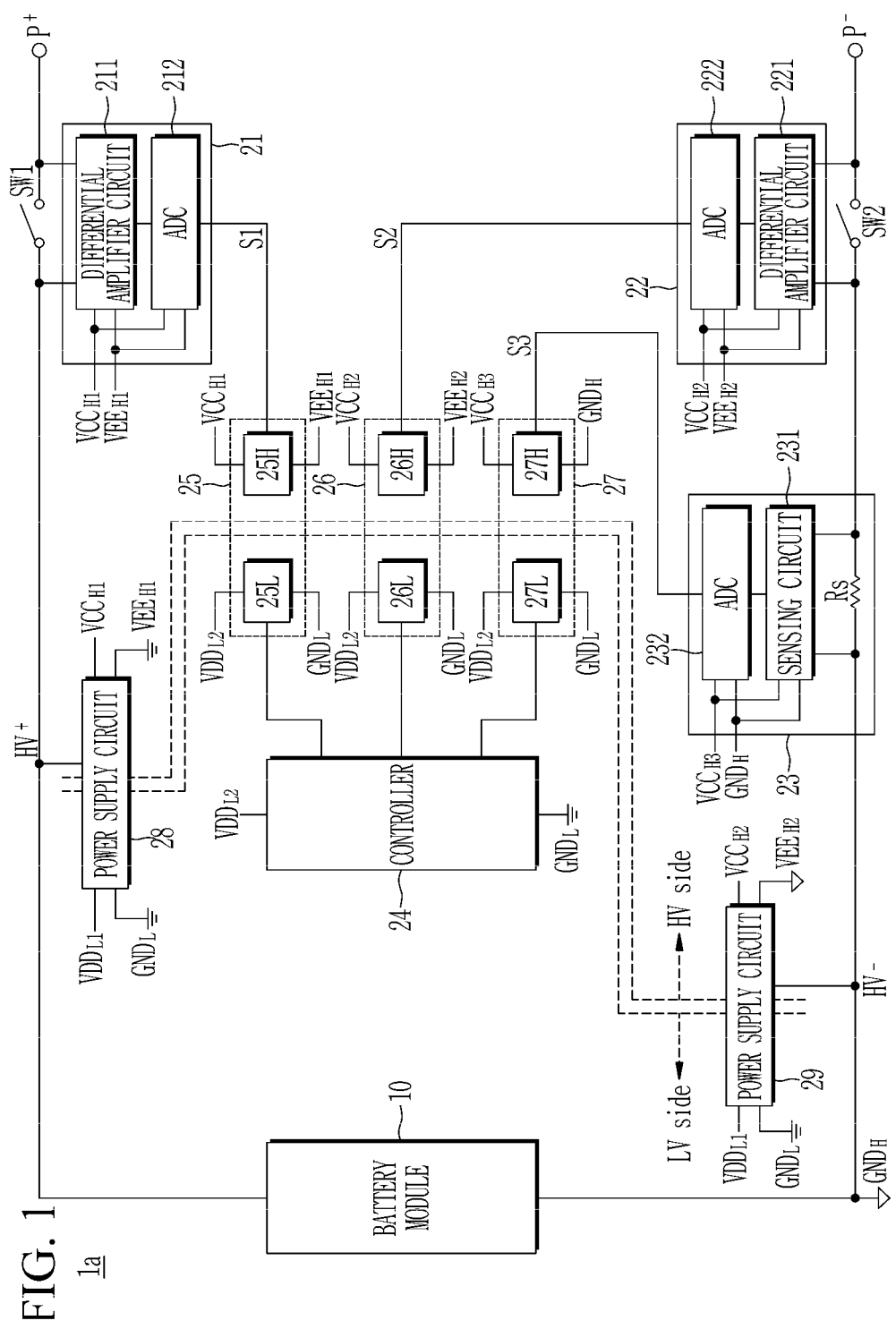
FIG. 1 schematically illustrates a battery pack according to one or more embodiments.

Embodiments of the present disclosure will now be described in detail with reference to the accompanying drawings. Hereinafter, an operation aspect and a method of implementing the same according to one or more embodiments of the present disclosure will be described with reference to the accompanying drawings. In the drawings, the same reference numerals denote the same elements, and redundant explanations will be omitted. However, the present disclosure may be embodied in various forms, and should not be construed as being limited only to the embodiments shown herein. Rather, these embodiments are provided by way of example to make the present disclosure thorough and complete, and will fully convey aspects and features of the present disclosure to those skilled in the art.

Accordingly, processes, elements, and techniques deemed not necessary to those skilled in the art for complete understanding of aspects and features of the present disclosure may not be described. In the drawings, the relative sizes of elements, layers, and regions may be exaggerated for clarity.

As used herein, the term "and/or" includes any and all combinations of one or more related listed items. The use of "can/may" in describing an embodiment of the present disclosure indicates "at least one embodiment of the present disclosure."

In the following description of one or more embodiments of the present disclosure, terms in the singular form may include plural forms unless the context clearly indicates otherwise.

It will be understood that terms including ordinal numbers such as "first", "second", "third", etc. are used to describe various elements, but these elements should not be limited by these terms. These terms are only used to distinguish one element from another. For example, a first constituent element may be referred to as a second constituent element, and the second constituent element may be referred to as the first constituent element without departing from the scope of the present disclosure. As used herein, the term "and/or" includes any and all combinations of one or more related listed items. An expression such as "at least one" precedes a list of elements, modifying the entire list of elements and not individual elements of the list.

As used in this specification, the terms "substantially", "approximately", and similar terms are used as approximate terms but are not used as degree terms, and they are not intended to illustrate inherent deviations of measured or calculated values evident to those skilled in the art. In addition, if the term "substantially" is used in combination with a characteristic that can be expressed using numerical values, the term "substantially" refers to including a range of +/−5% of the value.

If one component or layer is described as "on", "connected to", or "coupled" to another component or layer, "on", "connected to" and "coupled to" "Includes those formed directly or through the intervening of one or more other components or layers. In addition, if one component or layer is described as being "between" two components or layers, it should be understood that it is the only component or layer between two components or layers, or that there are one or more intervening other components or layers.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing one or more embodiments, an expression of connection indicates electrical connection unless explicitly described to be direct connection.

FIG. 1 schematically illustrates a battery pack according to one or more embodiments.

Referring to FIG. 1, the battery pack 1*a* according to one or more embodiments may include a plurality of pack terminals P+ and P−, a battery module 10, a plurality of switches SW1 and SW2, and a switch diagnosis device.

The pack terminals P+ and P− may be connected to external devices (e.g., a load, a charger, etc.) of the battery pack 1*a*. The pack terminals P+ and P− may transfer discharge power supplied from the battery module 10 to a load or charge power applied from a charger to the battery module 10.

The battery module 10 may include a plurality of cells connected in series and/or parallel to each other to provide a high voltage output.

The switches SW1 and SW2 may be connected between the output terminals of the battery module 10 and the pack terminals P+ and P−, respectively. The switch SW1 may be connected between a positive output terminal of the battery module 10 and the positive pack terminal P+ to block or allow current flow between the two terminals. The switch SW2 may be connected between a negative output terminal of the battery module 10 and the negative pack terminal P− to block or allow current flow between the two terminals.

The switches SW1 and SW2 may include a switching means that allows or blocks current flow through mechanical contact, using, for example, a relay or a contactor.

The switch diagnosis device may be further configured to detect the contact resistance of each of the switches SW1 and SW2, and to diagnose a deterioration state of each of the switches SW1 and SW2 based on the detected contact resistance. To this end, the switch diagnosis device may include a plurality of voltage-sensing circuits 21 and 22, a current-sensing circuit 23, and a controller 24.

The voltage-sensing circuits 21 and 22 may be connected to opposite ends of the respective switches SW1 and SW2 to detect voltages across the switches SW1 and SW2 (e.g., voltage-sensing circuits 21 and 22 may be connected to sense voltage between two terminals of each of the switches SW1 and SW2), respectively. The voltage-sensing circuits 21 and 22 may output voltage signals S1 and S2 in response to the detected voltages.

The voltage-sensing circuits 21 and 22 may respectively include differential amplifier circuits 211 and 221 and analog-to-digital converters (ADCs) 212 and 222.

The differential amplifier circuits 211 and 221 may be connected to opposite ends of the switches SW1 and SW2, respectively, and may respectively amplify and output voltages across the switches SW1 and SW2. Amplification gains of the differential amplifier circuits 211 and 221 may be set in consideration of the contact resistance variation of the switch in a normal state, and they may be configured to have an amplification gain of 1 or more. For example, the differential amplifier circuits 211 and 221 may be configured to have an amplification gain between 1 and 10.

The differential amplifier circuits 211 and 221 may be connected to bus bars (or contacts) constituting opposite ends of the corresponding switches SW1 and SW2 through a direct connection method through laser welding, etc., or an indirect connection method through wire harness, etc.

The ADCs 212 and 222 may respectively convert analog signals outputted from the differential amplifier circuits 211 and 221 into digital voltage signals S1 and S2 to output the converted voltage signals S1 and S2.

The current-sensing circuit 23 may detect a current flowing in a high current path of the battery pack 1a through the switches SW1 and SW2. The current-sensing circuit 23 may output a current signal S3 corresponding to the detected current. In this document, a 'high current path' is a current path between the battery module 10 and the pack terminals P+ and P−, and represents a path through which a charge or discharge current of the battery module 10 flows.

The current-sensing circuit 23 may include a shunt resistor, a hall sensor, a flux gate sensor, and the like.

Referring to FIG. 1 as an example, the current-sensing circuit 23 may include a shunt resistor Rs and a sensing circuit 231 connected to opposite ends of the shunt resistor Rs to sense a current flowing through the shunt resistor Rs. Because a resistance value of the shunt resistor Rs is a fixed value, a voltage across the shunt resistor Rs may change in response to the current flowing through the shunt resistor Rs. Accordingly, the sensing circuit 231 may detect the current flowing through the shunt resistor Rs from the voltage across the shunt resistor Rs, and may output a signal corresponding to the detected current.

The current-sensing circuit 23 may further include an ADC 232 to convert an analog signal outputted from the sensing circuit 231 into a digital signal. The ADC 232 may convert the analog current signal outputted from the sensing circuit 231 into a digital current signal S3 to output the signal S3.

In one or more embodiments, the sensing circuit 231 may amplify the current signal with a suitable amplification gain (e.g., a predetermined amplification gain) before outputting the current signal to the ADC 232 to output the current signal S3. Due to this amplification, even minute changes in current may be sensed, improving current sensing accuracy. An amplification gain of the sensing circuit 231 may be changed according to current specification of the battery pack 1a. That is, the sensing circuit 231 may be configured to be able to vary the amplification gain, and a value thereof may be determined according to the current specification of the battery pack 1a to which the switch diagnosis device is mounted.

The sensing circuit 231 may be included in an analog front end (AFE) circuit of the battery pack 1a.

The controller 24 may respectively receive the voltage signals S1 and S2 corresponding to the voltages across the switches SW1 and SW2 from the voltage-sensing circuits 21 and 22 of the switches SW1 and SW2. In addition, the controller 24 may receive the current signal S3 corresponding to the current flowing in the high current path of the battery pack 1a from the current-sensing circuit 23 through the switches SW1 and SW2.

The controller 24 may calculate contact resistance of each of the switches SW1 and SW2 based on the received voltage signals S1 and S2 and the current signal S3.

To calculate the contact resistance of each of the switches SW1 and SW2, it is suitable to detect a voltage and current across each of the switches SW1 and SW2 in a closed state. Accordingly, the controller 24 may use the voltage signals S1 and S2 and the current signal S3 that are detected in the closed state of the switches SW1 and SW2 to calculate the contact resistance of the switches SW1 and SW2.

If the current flowing through the high current path of the battery pack 1a changes rapidly, a sensing error occurs due to a phase difference between voltage and current sensing values, which may decrease accuracy of determining the contact resistance. In addition, during a period in which a direction of the current flowing through the high current path of the battery pack 1a is changed, there may be a period in which the contact resistance is instantaneously detected as infinite, and if the current flowing through the high current path is low, the sensing error may increase, and the accuracy of determining the contact resistance may also decrease. Accordingly, the controller 24 may monitor the current flowing through the high current path of the battery pack 1a to check whether a current flow satisfies a corresponding condition, and may calculate the contact resistance of the switches SW1 and SW2 using the voltage signals S1 and S2 and the current signal S3 obtained in a state where the current flow satisfies a corresponding condition (e.g., the voltage signals S1 and S2 and the current signal S3 detected in the closed state of the switches SW1 and SW2). For example, the controller 24 may determine that an average current flowing through the high current path of the battery pack 1a during a suitable period (e.g., a predetermined period) is within a suitable range (e.g., a predetermined range) including an upper limit value and a lower limit value, and if a differential value (di/dt) of the current flowing through the high current path is below a suitable value (e.g., a predetermined value or a predetermined threshold value), the controller 24 may calculate the contact resistance of the switches SW1 and SW2 using the voltage signals S1 and S2 and the current signal S3 obtained during the corresponding period. In addition, for example, the controller 24 may calculate the contact resistance of the switches SW1 and SW2 by using the voltage signals S1 and S2 and the current signal S3 detected during a period in which the battery module 10 is being charged with a constant current by a current within a suitable range (e.g., a predetermined range).

If the contact resistance of each of the switches SW1 and SW2 is calculated, the controller 24 may diagnose a deterioration state of each of the switches SW1 and SW2 based on the calculated contact resistance. For example, the controller 24 may determine that the corresponding switches SW1 and SW2 are deteriorated if the contact resistance of the switches SW1 and SW2 is equal to or greater than a threshold (e.g., a predetermined threshold). If it is determined that the switches SW1 and SW2 are deteriorated, the controller 24 may output a diagnosis signal warning of a deterioration state of the switches SW1 and SW2 to an upper controller (e.g., an electronic control unit (ECU) of an electric vehicle).

The controller 24 may be a controller constituting a battery management system (BMS) that manages an overall operation of the battery pack 1a.

The battery pack 1a may include a high voltage (HV) system (hereinafter, referred to as a high voltage side) including the battery module 10 which is a power source at the high voltage side and a low voltage (LV) system (hereinafter, referred to as a low voltage side) including the controller 24, and the low voltage system and the high voltage system may be isolated from each other by galvanic isolation. Galvanic isolation refers to a circuit technique that allows two or more electrical circuits to communicate with each other while blocking an unwanted DC current. Galvanic isolation may be implemented using magnetic induction, capacitance, optical signals, electromagnetic waves, or acoustic signals. Using galvanic isolation, it is possible to reduce or prevent the likelihood of formation of a communication path between systems having different reference potentials, or an unwanted current from flowing due to a ground loop.

In one or more embodiments, the voltage-sensing circuits 21 and 22 and the current-sensing circuit 23 are a high voltage component, unlike the controller 24, which is a low voltage component. Accordingly, it is suitable to construct a communication path using galvanic isolation to transfer the signals S1, S2, and S3 generated by the voltage-sensing circuits 21 and 22 and the current-sensing circuit 23 to the controller 24. To this end, the switch diagnosis device may further include a plurality of isolated communication circuits 25, 26, and 27.

The isolated communication circuit 25 may receive the voltage signal S1 corresponding to the voltage across the switch SW1 from the voltage-sensing circuit 21 at the high voltage side, and may transmit the voltage signal S1 to the controller 24 at the low voltage side through an isolated communication method. The isolated communication circuit 25 may include a high voltage sub-circuit 25H connected to the voltage-sensing circuit 21 and a low voltage sub-circuit 25L connected to the controller 24. The high voltage sub-circuit 25H may receive the voltage signal S1 from the voltage-sensing circuit 21, and may transmit the voltage signal S1 to the low voltage sub-circuit 25L in an isolated communication method. The low voltage sub-circuit 25L may transfer the voltage signal S1 transferred from the high voltage sub-circuit 25H through the isolated communication method to the controller 24.

The isolated communication circuit 26 may receive the voltage signal S2 corresponding to the voltage across the switch SW2 from the voltage-sensing circuit 22 at a high voltage side, and may transmit the voltage signal S2 to the controller 24 at a low voltage side through an isolated communication method. The isolated communication circuit 26 may include a high voltage sub-circuit 26H connected to the voltage-sensing circuit 22 and a low voltage sub-circuit 26L connected to the controller 24. The high voltage sub-circuit 26H may receive the voltage signal S2 from the voltage-sensing circuit 22, and may transmit the voltage signal S2 to the low voltage sub-circuit 26L in an isolated communication method. The low voltage sub-circuit 26L may transfer the voltage signal S2 transferred from the high voltage sub-circuit 26H through the isolated communication method to the controller 24.

The isolation communication circuit 27 may receive the current signal S3 corresponding to the current flowing through the high current path from the current-sensing circuit 23 at the high voltage side, and may transmit the current signal S3 to the controller 24 at the low voltage side in the isolated communication method. The isolated communication circuit 27 may include a high voltage sub-circuit 27H connected to the current-sensing circuit 23 and a low voltage sub-circuit 27L connected to the controller 24. The high voltage sub-circuit 27H may receive the current signal S3 from the current-sensing circuit 23, and may transmit the current signal S3 to the low voltage sub-circuit 27L in an isolated communication method. The low voltage sub-circuit 27L may transfer the current signal S3 transferred from the high voltage sub-circuit 27H through the isolated communication method to the controller 24.

The isolated communication circuits 25, 26, and 27 may transfer signals between the low voltage side and the high voltage side in various communication methods such as a serial peripheral interface (SPI), an inter-integrated circuit (I2C), single edge nibble transmission (SENT), a controller area network (CAN), and the like.

The battery pack $1a$ may further include power supply circuits 28 and 29 for supplying a driving voltage to the isolated communication circuits 25 and 26.

The power supply circuit 28 may receive the supply voltage $VDD_{L1}$ at the low voltage side, and may output a supply voltage $VCC_{H1}$ at the high voltage side, converted therefrom. The power supply circuit 28 may include an isolated DC-DC converter (e.g., a flyback converter) including a primary side receiving the supply voltage $VDD_{L1}$ at the low voltage side and a secondary side outputting the supply voltage $VCC_{H1}$ at the high voltage side. A secondary circuit of the power supply circuit 28 may be connected to a node HV+ connected to a positive output terminal of the battery module 10, and may generate a reference potential $VEE_{H1}$ of the supply voltage $VCC_{H1}$ based on a potential of the node HV+. A reference potential of the supply voltage $VCC_{H1}$ may be lower than the potential of the node HV+.

The supply voltage $VCC_{H1}$ outputted from the power supply circuit 28 may be supplied as a driving voltage for the differential amplifier circuit 211 and the ADC 212 of the voltage-sensing circuit 21 and the high voltage sub-circuit 25H of the isolated communication circuit 25. The low voltage sub-circuit 25L of the isolated communication circuit 25 may operate using a supply voltage $VDD_{L2}$ supplied from a low voltage power source at the low voltage side as a driving voltage. The supply voltage $VDD_{L2}$ may be used as a driving voltage of the controller 24.

The power supply circuit 29 may receive the supply voltage $VDD_{L1}$ at the low voltage side, and may output a supply voltage $VCC_{H2}$ at the high voltage side, converted therefrom. The power supply circuit 29 may include an isolated DC-DC converter (e.g., a flyback converter) including a primary side receiving the supply voltage $VDD_{L1}$ at the low voltage side and a secondary side outputting the supply voltage $VCC_{H2}$ at the high voltage side. A secondary circuit of the power supply circuit 29 may be connected to a node HV-connected to a negative output terminal of the battery module 10, and may generate a reference potential $VEE_{H2}$ of the supply voltage $VCC_{H2}$ based on a potential of the node HV-. A reference potential of the supply voltage $VCC_{H2}$ may be lower than the potential of the node HV-.

The supply voltage $VCC_{H2}$ outputted from the power supply circuit 29 may be supplied as a driving voltage for the differential amplifier circuit 221 and the ADC 222 of the voltage-sensing circuit 22 and the high voltage sub-circuit 26H of the isolated communication circuit 26. The low voltage sub-circuit 26L of the isolated communication circuit 26 may operate using a supply voltage $VDD_{L2}$ supplied from a low voltage power source at the low voltage side as a driving voltage.

The supply voltage $VDD_{L1}$ at the low voltage side inputted to the power supply circuits 28 and 29 may be a voltage supplied from an outside of the battery pack $1a$ (e.g., a vehicle equipped with the battery pack $1a$) to reduce or minimize power consumption of the battery pack $1a$. However, the present disclosure is not limited thereto, and the supply voltage $VDD_{L1}$ at the low voltage side inputted to the power supply circuits 28 and 29 may be a voltage supplied from a low voltage power source positioned inside the battery pack $1a$. In this case, the supply voltage $VDD_{L1}$ may be a voltage supplied from the same low voltage power source as the supply voltage $VDD_{L2}$ at the low voltage side, used as a driving voltage of the controller 24.

The sensing circuit 231 and the ADC 232 of the current-sensing circuit 23 and the high voltage sub-circuit 27H of the isolated communication circuit 27 may be driven by a supply voltage $VCC_{H3}$ at the high voltage side with a ground potential $GND_H$ at the high voltage side as a reference potential. The supply voltage $VCC_{H3}$ may be a voltage converted from the battery module 10 or a low voltage power source at the low voltage side through a separate power supply circuit. The supply voltage $VCC_{H3}$ may be a voltage converted from the above-described supply voltage $VCC_{H1}$ or supply voltage $VCC_{H2}$.

Figure 2:
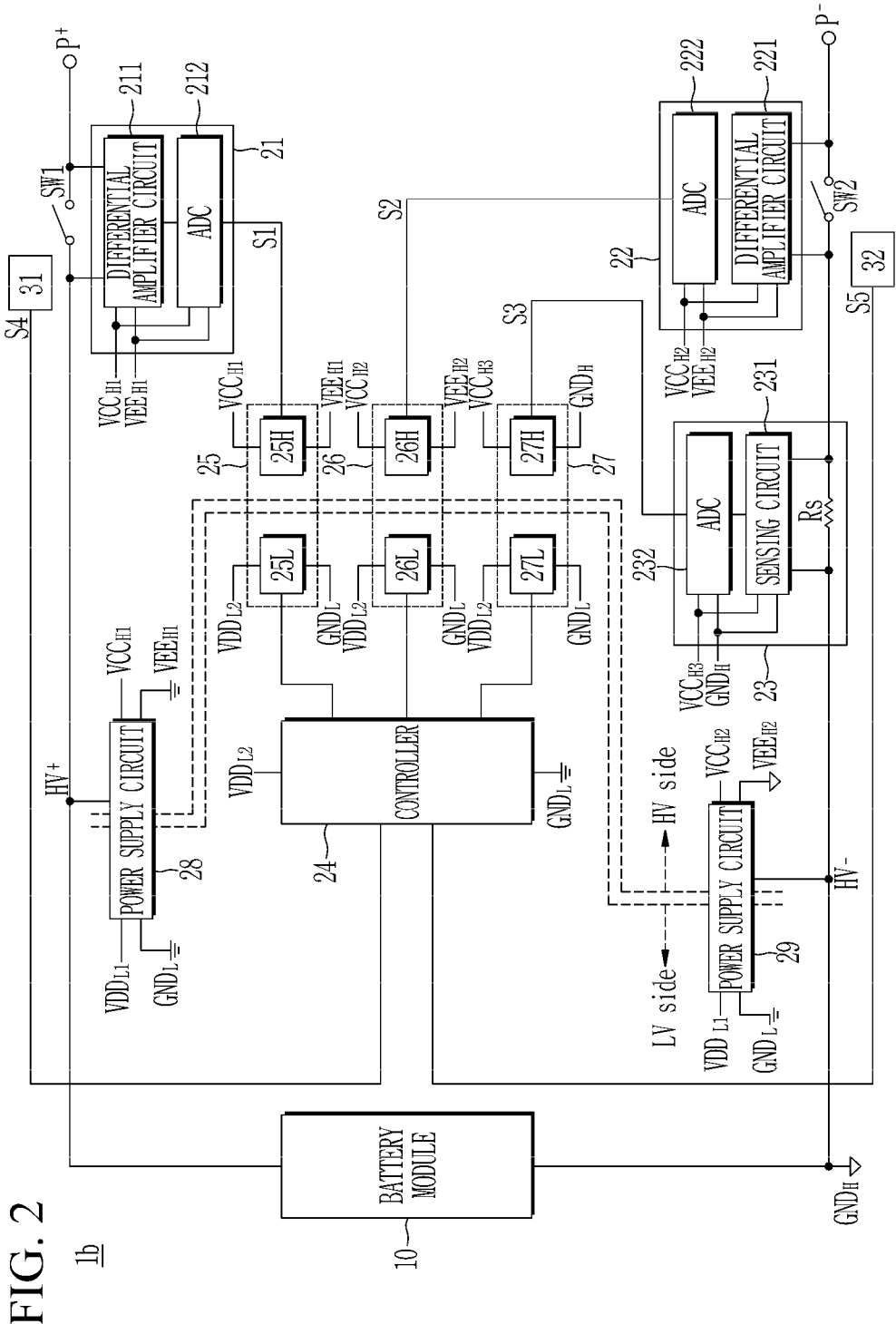
FIG. 2 schematically illustrates a control server of a battery pack according to one or more embodiments.

FIG. 2 schematically illustrates a control server of a battery pack according to one or more embodiments.

Referring to FIG. 2, the battery pack 1b according to one or more embodiments may further include temperature sensors 31 and 32 compared to the battery pack 1a described with reference to FIG. 1.

Each of the temperature sensors 31 and 32 may detect the temperature of each of the switches SW1 and SW2 to output temperature signals S4 and S5. Each of the temperature sensors 31 and 32 may be positioned in contact with or adjacent to bus bars (or contacts) constituting opposite ends of the corresponding switch SW1 or SW2 for temperature measurement.

The controller 24 may receive the temperature signals S4 and S5 corresponding to the temperatures of the respective switches SW1 and SW2 from the temperature sensors 31 and 32. If the temperature signals S4 and S5 are received, the controller 24 may increase diagnosis coverage by using contact resistance of each of the switches SW1 and SW2 to diagnose deterioration states of the switches SW1 and SW2. For example, the controller 24 may determine that the switches SW1 and SW2 are in a deteriorated state or in a welded state if the temperatures of the switches SW1 and SW2 indicated by the temperature signals S4 and S5 are higher than a threshold (e.g., a predetermined threshold).

According to the embodiments described above, the battery packs 1a and 1b may calculate the contact resistance of on other types of circuit carriers. The conductive element may include, for example, metallization, such as surface metallization, and/or pins, and may include conductive polymers or ceramics. Electrical energy may also be transmitted via a wireless connection using, for example, electromagnetic radiation or light.

In addition, various components of these devices may be executed on one or more processors to perform various functions described herein and within one or more computing devices, and may be processes or threads that execute computer program instructions and may interact with other system components. Computer program instructions are stored in a memory that can be implemented in a computing device using a standard memory device, such as, for example, a random access memory (RAM). The computer program instructions may also be stored on other non-transitory computer readable media (e.g., CD-ROMs, flash drives, and the like).

In addition, those skilled in the art should recognize that the functions of various computing devices may be combined or integrated into a single computing device, or a function of a computing device may be distributed across one or more other computing devices without departing from the spirit and scope of the present disclosure.

While the present disclosure has been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims and their equivalents.

| Description of Some of the Reference Characters | |
|---|---|
| 1a, 1b: battery pack | 10: battery module |
| 21, 22: voltage-sensing circuit | 211, 221: differential amplifier circuit |
| 212, 222: ADC of voltage-sensing circuit | 23: current-sensing circuit |
| 231: sensing circuit | 232: ADC of current-sensing circuit |
| 24: controller | |
| 25, 26, 27: isolated communication circuit | |
| 25H, 26H, 27H: high voltage sub-circuit of isolated communication circuit | |
| 25L, 26L, 27L: low voltage sub-circuit of isolated communication circuit | |
| 28, 29: power supply circuit | 31, 32: temperature sensor |
| SW1, SW2: switch | P+, P -: pack terminal | the switches SW1 and SW2 using the voltage and current across the switches SW1 and SW2 directly sensed through the switch diagnosis device. The battery packs 1a and 1b also diagnose the deterioration state of the switches SW1 and SW2 from the contact resistance of the switches SW1 and SW2 calculated in this way, so that preemptive measures such as parts replacement are possible before welding occurs.

An electronic or electrical device and/or any other related device or component according to the embodiments of the present disclosure described herein may be implemented by using any suitable hardware, firmware (e.g., an application-specific integrated circuit), software, or a combination of software, firmware, and hardware. For example, various components of these devices may be located on one integrated circuit (IC) chip or on separate IC chips. In addition, various components of these devices may be implemented on a flexible printed circuit film (TCP), a tape carrier package (TCP), a printed circuit board (PCB), or on one substrate. The electrical connections or interconnections described in the present specification may be implemented by wires or conductive elements, for example, on a PCB or

What is claimed is:

1. A switch diagnosis device comprising:
   a switch connected to a battery module in a current path at a high voltage side;
   a voltage-sensing circuit configured to generate a voltage signal by sensing a voltage across the switch at the high voltage side;
   a current-sensing circuit configured to generate a current signal by detecting a current flowing through the current path;
   a controller configured to:
      receive the voltage signal and the current signal;
      calculate contact resistance of the switch based on the voltage signal and the current signal; and
      diagnose a deterioration state of the switch based on the contact resistance; and
   a first isolated communication circuit configured to transfer the voltage signal outputted from the voltage-sensing circuit to the controller at a low voltage side that is galvanically isolated from the high voltage side,
   wherein the controller is configured to calculate the contact resistance of the switch by using the voltage signal and the current signal detected during a period in which the battery module is being charged with a constant current within a range.

2. The switch diagnosis device as claimed in claim 1, wherein the first isolated communication circuit comprises:

a first sub-circuit configured to transmit the voltage signal received from the voltage-sensing circuit at the high voltage side to the low voltage side in an isolated communication method; and a second sub-circuit configured to transmit the voltage signal received from the first sub-circuit at the high voltage side to the controller at the low voltage side.

3. The switch diagnosis device as claimed in claim 2, further comprising a power supply circuit configured to supply a supply voltage for driving the voltage-sensing circuit and the first sub-circuit, and connected to a node between a power source at the high voltage side and the switch, and configured to determine a reference potential of the supply voltage based on a potential of the node.

4. The switch diagnosis device as claimed in claim 3, wherein the power supply circuit comprises an isolated DC-DC converter configured to generate the supply voltage from a voltage inputted from the low voltage side, and the isolated DC-DC converter is a flyback converter.

5. The switch diagnosis device as claimed in claim 1, wherein the voltage-sensing circuit comprises:

a differential amplifier circuit connected to opposite ends of the switch; and an analog-to-digital converter configured to generate the voltage signal from an output signal of the differential amplifier circuit, the voltage signal being a digital signal.

6. The switch diagnosis device as claimed in claim 1, wherein the current-sensing circuit comprises:

a shunt resistor connected to the current path;

a sensing circuit configured to output a signal corresponding to a current flowing through the switch from a voltage across the shunt resistor; and an analog-to-digital converter configured to generate the current signal from a signal output from the sensing circuit, the current signal being a digital signal.

7. The switch diagnosis device as claimed in claim 6, further comprising a second isolated communication circuit configured to transfer the current signal outputted from the current-sensing circuit to the controller at the low voltage side.

8. The switch diagnosis device as claimed in claim 1, wherein the controller is configured to:

calculate the contact resistance using the voltage signal and the current signal obtained by sensing a voltage across the switch and a current flowing through the switch during the period, wherein, during the period, the current flowing through the current path in a state in which the switch is closed satisfies a condition, and determine that the condition is satisfied if the current flowing through the current path is within the range and a differential value of the current flowing through the current path is within a value.

9. A battery pack comprising:

pack terminals;

a battery module comprising cells connected in series and/or in parallel to each other between the pack terminals;

a first switch connected between a first output terminal of the battery module and a first pack terminal from among the pack terminals at a high voltage side, the first switch being configured to open and close a current path between the pack terminals and the battery module;

a first voltage-sensing circuit configured to generate a first voltage signal by sensing a voltage across the first switch at the high voltage side;

a current-sensing circuit configured to generate a current signal by detecting a current flowing through the current path;

a controller configured to receive the first voltage signal and the current signal, to calculate first contact resistance of the first switch based on the first voltage signal and the current signal, and to diagnose a deterioration state of the first switch based on the first contact resistance; and a first isolated communication circuit configured to transfer the first voltage signal outputted from the first voltage-sensing circuit to the controller at a low voltage side that is galvanically isolated from the high voltage side, wherein the controller is configured to calculate the first contact resistance of the first switch by using the first voltage signal and the current signal detected during a period in which the battery module is being charged with a constant current within a range.

10. The battery pack as claimed in claim 9, wherein the first isolated communication circuit comprises:

a first high voltage sub-circuit configured to transmit the first voltage signal received from the first voltage-sensing circuit at the high voltage side in an isolated communication method; and a first low voltage sub-circuit configured to transmit the first voltage signal received from the first high voltage sub-circuit to the controller at the low voltage side.

11. The battery pack as claimed in claim 10, further comprising a first power supply circuit configured to supply a first supply voltage for driving the first voltage-sensing circuit and the first high voltage sub-circuit, wherein a reference potential of the first supply voltage is determined based on a potential of the first output terminal and comprises an isolated DC-DC converter configured to generate the first supply voltage from a voltage inputted from the low voltage side.

12. The battery pack as claimed in claim 11, wherein the voltage inputted from the low voltage side is a supply voltage supplied from a vehicle equipped with the battery pack.

13. The battery pack as claimed in claim 9, further comprising:

a second switch connected between a second output terminal of the battery module and a second pack terminal from among the pack terminals, and configured to open and close the current path;

a second voltage-sensing circuit configured to generate a second voltage signal by sensing a voltage across the second switch at the high voltage side; and a second isolated communication circuit configured to transmit the second voltage signal outputted from the second voltage-sensing circuit to the controller at the low voltage side, wherein the controller is further configured to calculate second contact resistance of the second switch based on the second voltage signal and the current signal, and to diagnose a deterioration state of the second switch based on the second contact resistance.

14. The battery pack as claimed in claim 13, wherein the second isolated communication circuit comprises:

a second high voltage sub-circuit configured to transmit the second voltage signal received from the second voltage-sensing circuit at the high voltage side in an isolated communication method; and a second low voltage sub-circuit configured to transmit the second voltage signal received from the second high voltage sub-circuit to the controller at the low voltage side.

15. The battery pack as claimed in claim 14, further comprising a second power supply circuit configured to supply a second supply voltage for driving the second voltage-sensing circuit and the second high voltage sub-circuit, wherein a reference potential of the second supply voltage is determined based on a potential of the second output terminal.

16. The battery pack as claimed in claim 9, wherein the first voltage-sensing circuit comprises:

a differential amplifier circuit connected to opposite ends of the first switch; and an analog-to-digital converter configured to generate the first voltage signal from an output signal of the differential amplifier circuit, the first voltage signal being a digital signal.

17. The battery pack as claimed in claim 9, further comprising a second isolated communication circuit configured to transfer the current signal outputted from the current-sensing circuit to the controller at the low voltage side, wherein the current-sensing circuit comprises:

a shunt resistor connected to the current path;

a sensing circuit configured to output a signal corresponding to the current flowing in the current path from a voltage across the shunt resistor; and an analog-to-digital converter configured to generate the current signal from a signal output from the sensing circuit, the current signal being a digital signal.

18. The battery pack as claimed in claim 9, wherein the controller is configured to calculate the first contact resistance using the first voltage signal and the current signal obtained by sensing a voltage across the first switch and a current flowing through the first switch during the period, wherein during the period the current flowing through the current path in a state in which the first switch is closed satisfies a condition.

19. The battery pack as claimed in claim 18, wherein the controller is further configured to determine that the condition is satisfied if the current flowing through the current path is within the range and a differential value of the current flowing through the current path is within a value.

20. The battery pack as claimed in claim 9, further comprising a temperature sensor configured to sense a temperature of the first switch, wherein the controller is further configured to diagnose the deterioration state of the first switch based on a temperature signal received from the temperature sensor and the first contact resistance.

\* \* \* \* \*